United States Patent [19]

Trumpp et al.

[11] Patent Number: 5,221,922
[45] Date of Patent: Jun. 22, 1993

[54] BROADBAND SIGNAL SWITCHING MATRIX NETWORK

[75] Inventors: Gerhard Trumpp, Puchheim; Jan Wolkenhauer, Munich, both of Fed. Rep. of Germany

[73] Assignee: Siemens Aktiengesellschaft, Munich, Fed. Rep. of Germany

[21] Appl. No.: 640,530

[22] Filed: Jan. 11, 1991

Related U.S. Application Data

[63] Continuation of Ser. No. 390,838, Aug. 8, 1989, abandoned.

[30] Foreign Application Priority Data

Aug. 8, 1988 [EP] European Pat. Off. ............ 88112908

[51] Int. Cl.$^5$ ................................................ H04B 1/00
[52] U.S. Cl. ............................ 340/825.91; 340/825.85
[58] Field of Search ................ 340/825.85, 825.86, 340/825.87, 825.89, 825.90, 825.91, 825.79; 307/241, 451, 453, 452, 481, 571, 573; 379/291, 292

[56] References Cited

U.S. PATENT DOCUMENTS

| | | | |
|---|---|---|---|
| 3,737,588 | 6/1973 | Susi | 379/292 |
| 3,980,831 | 9/1976 | Mertel | 379/54 |
| 4,621,202 | 11/1986 | Pumo | 307/241 |
| 4,645,944 | 2/1987 | Uya | 307/243 |
| 4,745,409 | 5/1988 | Hofmann | 307/241 |
| 4,801,936 | 1/1989 | Hofmann | 340/825.91 |
| 4,998,101 | 3/1991 | Trumpp et al. | 340/825.87 |
| 5,043,724 | 8/1991 | Trumpp et al. | 340/825.89 |

FOREIGN PATENT DOCUMENTS 0262479 9/1987 European Pat. Off. .
0264046 10/1987 European Pat. Off. .

Primary Examiner—Sandra L. O'Shea
Assistant Examiner—Dervis Magistre
Attorney, Agent, or Firm—Hill, Steadman & Simpson

[57] ABSTRACT

In a broadband signal switching matrix network having a cross-point matrix in FET technology whose switching elements, controlled by a holding memory cell, are each formed with a series circuit of a switching transistor and of an input transistor. Matrix output lines thereof are respectively connected to one terminal of the operating voltage source via a pre-charging transistor that is controlled by a pre-charging clock, that side of the series circuit connected opposite from the matrix output line being permanently connected to the other terminal of the operating voltage source (directly or via a transistor controlled by the output signal and individually associated to the matrix output line) in order to avoid sample clock lines that lead to the switching elements.

6 Claims, 3 Drawing Sheets

BROADBAND SIGNAL SWITCHING MATRIX NETWORK

This is a continuation of application Ser. No. 390,838, filed Aug. 8, 1989 now abandoned.

BACKGROUND OF THE INVENTION

Modern developments in telecommunications technology have lead to integrated services communications transmission and switching systems for narrow band and broadband communications services that have light waveguides in the region of the subscriber lines as a transmission medium The light waveguides provide both narrow band communications services such as, in particular, 64 kbit/s digital telephony as well as broadband communications services such as, in particular, 140 Mbit/s picture telephone. As a result narrow band signal switching matrix networks and broadband signals switching matrix networks (preferably having shared control equipment) can also be provided side-by-side in the switching centers (see German Patent 24 21 002 and corresponding U.S. Pat. No. 3,980,831).

A known broadband signal switching matrix network (see, for example, European Patent A1 0 262 477 and corresponding U.S. Pat. No. 4,801,936) has a cross-point matrix in FET technology whose s elements are each formed with a switching transistor that has its control electrode charged with a through-connect or inhibit signal and has its main electrode connected to the appertaining matrix output line. The switching elements each have a series transistor forming a series circuit with the switching transistor. This series transistor has its control electrode connected to the appertaining matrix input line and its main electrode connected opposite from the series circuit being connected via a sampling transistor to one terminal of an operating voltage source to whose other terminal the respective matrix output line is connected via a precharging transistor. The pre-charging transistor and sampling transistor are respectively charged oppositely from one another at their control electrode with a switching matrix network selection clock that subdivides a bit through-connect time span into a pre-charging phase and into the actual through-connection phase. As a result the matrix output line, for an inhibited sampling transistor, is at least approximately charged in every preliminary phase to the potential at the other terminal of the operating voltage source.

This known broadband signal switching matrix network that can have sampling transistors individually associated to the switching elements or sampling transistors, which are individually associated to the matrix input line or matrix output line, requires separate clock lines that run through the cross-point matrix for selecting these sampling transistors. This requires a circuit surface space requirement and involves a corresponding capacitative load on the matrix output lines. In order to guarantee adequate protection against signal interference, clock distribution and couplings between matrix input lines and matrix output lines require adequately high signal amplitudes on the matrix output lines, this involving a relatively high power consumption.

SUMMARY OF THE INVENTION

An object of the present invention is to provide a broadband signal switching matrix network having limited dissipated power given adequate protection against disruption in which such disadvantages are avoided.

The present invention is directed to a broadband signal switching matrix network having a cross-point matrix in FET technology whose inputs can each be provided with an input driver circuit, whose outputs can each be provided with an output amplifier circuit, and each of whose switching elements controlled by a holding memory cell is respectively formed with a series circuit of a switching transistor whose control electrode is charged with a through-connect signal or inhibit signal and an input transistor that has its control electrode connected to the appertaining matrix input line. The series circuit has the main electrode of one transistor, that is connected opposite from the series circuit, connected to the appertaining matrix output line, the matrix output line being connected to a pre-charging potential source via a pre-charging circuit that has an unlocking input connected to the clock signal line of a pre-charging clock signal that defines the pre-charging phase of a bit through-connect time span that is subdivided into such a pre-charging phase and into the remaining bit through-connection time span. As a result the matrix output line is charged to a pre-charging potential in every pre-charging phase. This broadband switching matrix network is inventively characterized i that the main electrode of the other transistor that is connected opposite from the series circuit is continuously connected to a terminal of the operating voltage source.

In addition to providing the advantage of avoiding additional clock lines and, potentially, of being able to co-utilize the operating voltage supply of the cross-point-associated holding memory cell already required for the feed of the switching element controlled by this holding memory cell, the present invention provides the further advantage that the output line can be operated with a very small signal boost of, for example, 1 V for an operating voltage of, for example, 5 V. This producing a corresponding reduction in the dissipated powers. At the same time, the possible reduction of signal boost on the matrix output line also produces a reduction of disturbances of the operating voltage of the broadband signal switching matrix network that are caused by power peaks.

In a further development of the present invention, the main electrode of the other transistor, that is connected opposite from the series circuit, can be connected to the one terminal of the operating voltage source via a transistor individually associated to the matrix output line that has its control electrode connected to the output of an output amplifier circuit that is individually associated to the matrix output line. Given a corresponding change in signal status at the output of the output amplifier circuit, the transistor individually associated to the matrix output line is thereby inhibited, so that a further charge reversal of the output line is avoided and the signal boost is thus limited.

In a further development of the present invention, the transistor series circuit of each and every switching element can have its input transistor connected to the matrix output line.

Alternatively thereto, however, it is possible that, in a further development of the present invention, the transistor series circuit of each and every switching element has its switching transistor connected to the matrix output line, this avoiding a capacitative loading of the matrix output line by the channel capacitance of the series transistors of switching elements that are not through-connected.

BRIEF DESCRIPTION OF THE DRAWINGS

The features of the present invention which are believed to be novel are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
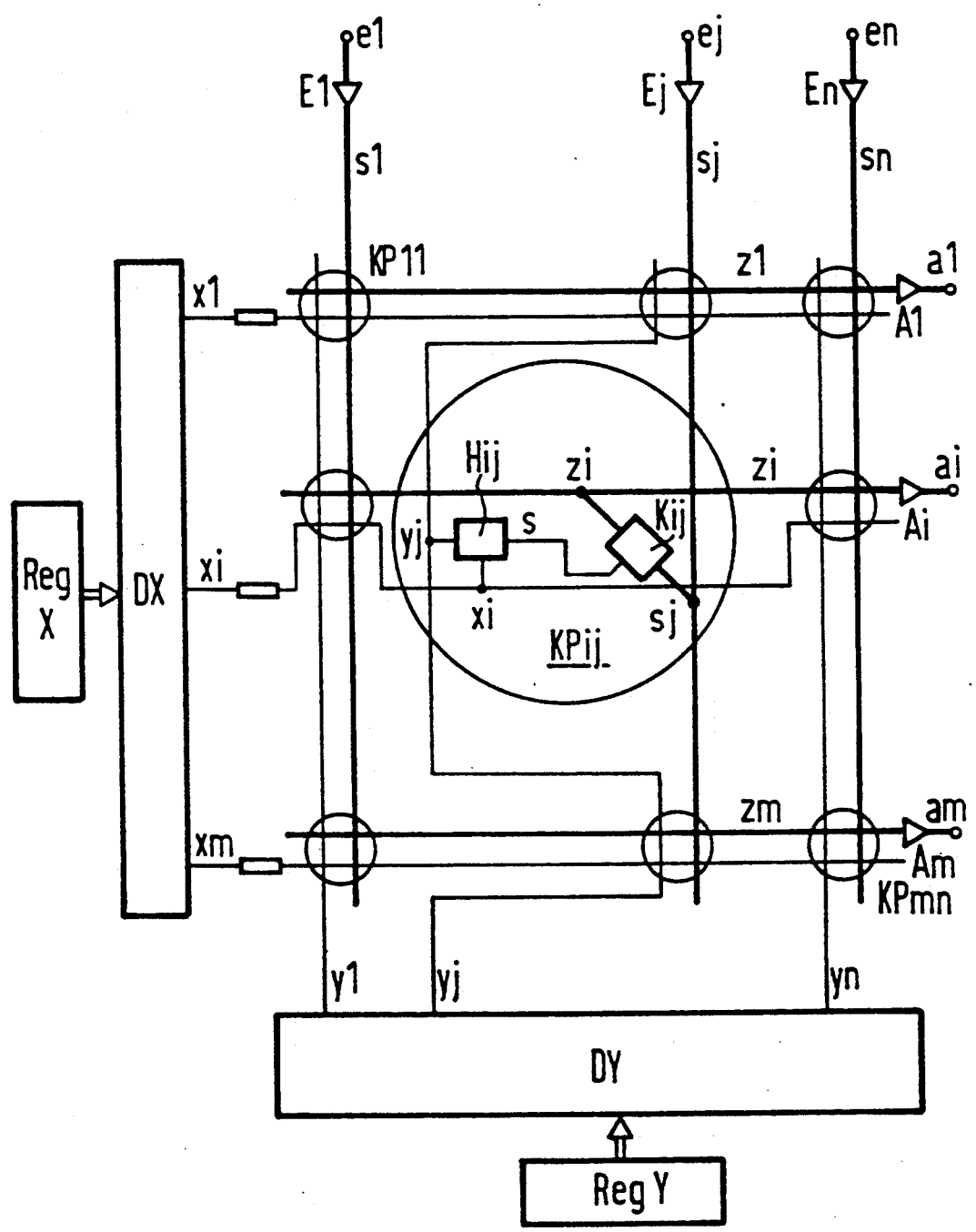
FIG. 1 is a schematic of a broadband switching matrix network.

FIG. 1 schematically depicts a broadband signal switching matrix network in a scope required for an understanding of the present invention. Input driver circuits El . . . Ej . . . En are provided at the input el . . . ej . . . en thereof that connect to column lines sl . . . sj . . . sn of a cross-point matrix and the outputs al . . . ai . . . am reached by row lines zl . . . zi . . . zm of the cross-point matrix are provided with output amplifier circuits Al . . . Ai . . . Am.

The cross-point matrix has cross-points KPll . . . KPij . . . KPmn whose switching element (as is indicated in greater detail in the case of the cross-point KPij for the switching element Kij thereof) can be respectively driven by a cross-point associated holding memory cell Hij (at the cross-point KPij) whose output s connects to the control input of the respective switching element (Kij at the cross-point KPij).

According to FIG. 1, the holding memory cells . . . Hij . . . are driven in two coordinates by two selection decoders, namely, a row decoder DX and a column decoder DY via corresponding selection lines xl . . . xi . . . xm; yl . . . yj . . . yn.

As may be seen from FIG. 1, the two selection decoders DX, DY may thereby be chargeable, proceeding from input registers Reg X, Reg Y, with a respective cross-point row address or, respectively, cross-point column address shared by a matrix line (row or column) of cross-points. In response thereto they respectively output a "1" selection signal to the selection line corresponding to the respective cross-point line address. The coincidence of a row selection signal "1" and of a column selection signal "1" at the intersection of the appertaining matrix row with the appertaining matrix column during the set-up of a corresponding call then effects an activation of the holding memory cell situated there, for example, the memory cell Hij. This has the result that the switching element controlled by the appertaining holding memory cell (Hij) becomes conductive, the switching element Kij in the example.

So that the switching element Kij under consideration in the example is again inhibited for a clear down of the appertaining call, the selection decoder DX is again charged with the appertaining row address proceeding from the input register Reg X, so that the row decoder DX again outputs a row selection signal "1" on its output line xi. Simultaneously, the column decoder DY, proceeding from its input register Reg Y, is charged, for example, with a dummy address or with the address of a column of unconnected cross-points, so that it outputs a column selection signal "0" on its output line yj. The coincidence of row selection signal "1" and column selection signal "0" then effects the resetting of the holding memory cell Hij, with the result that the switching element Kij controlled by it is inhibited.

Figure 5:
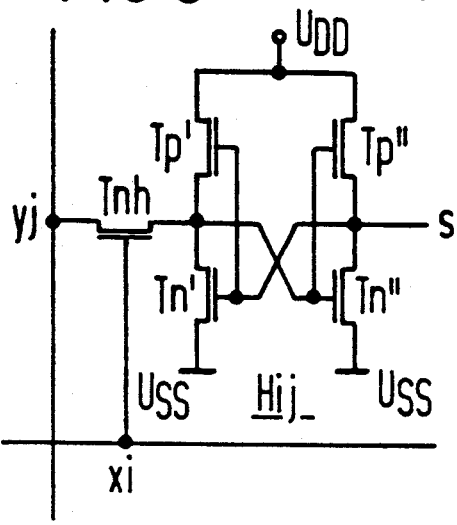
Figure 6:
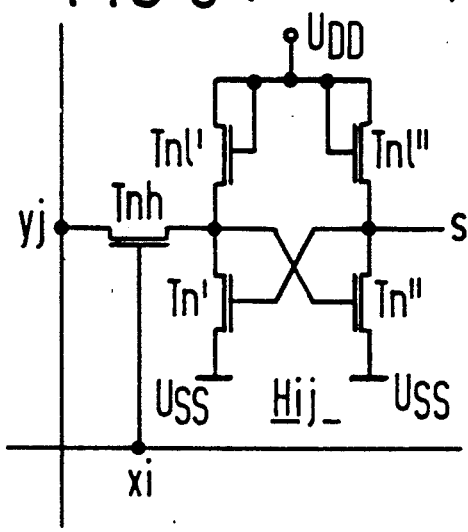

The holding memory cells . . . Hij . . . can be fashioned in a known manner. Thus, the holding memory cells (as known, for example, by European patent A 0 238 834 and also sketched in FIGS. 5 and 6) can be formed with an n-channel transistor Tnh and two cross-coupled inverter circuits (CMOS inverter circuits Tp' Tn'; Tp", Tn" in FIG. 5; n-MOS inverter circuits Tnl', Tnl'; Tnl", Tn" in FIG. 6), whereby one inverter circuit has its input side connected to the appertaining decoder output yj of the one selection decoder via the n-channel transistor Tnh that in turn has its control electrode charged with the output signal of the appertaining decoder output xi of the other selection decoder. One inverter circuit has its output side connected to the control input s of the appertaining switching element.

Figure 2:
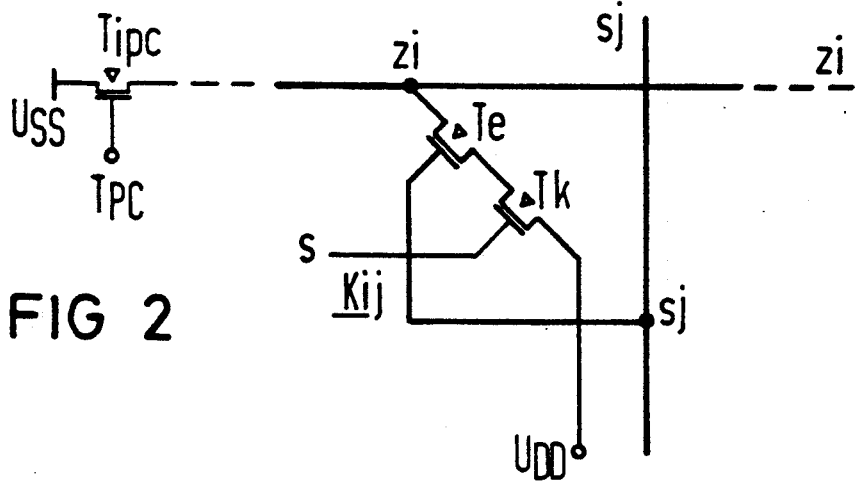
FIGS. 2-6 are circuit schematics of circuit-oriented details of the present invention.
Figure 3:
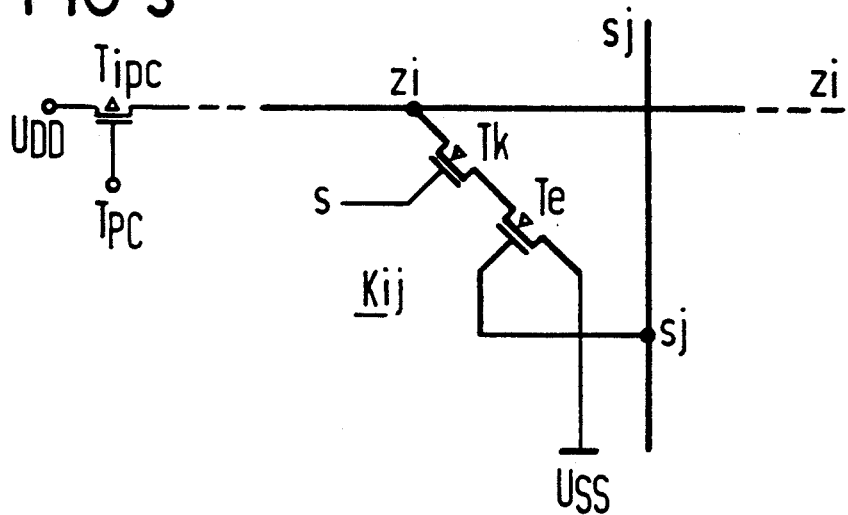
Figure 4:
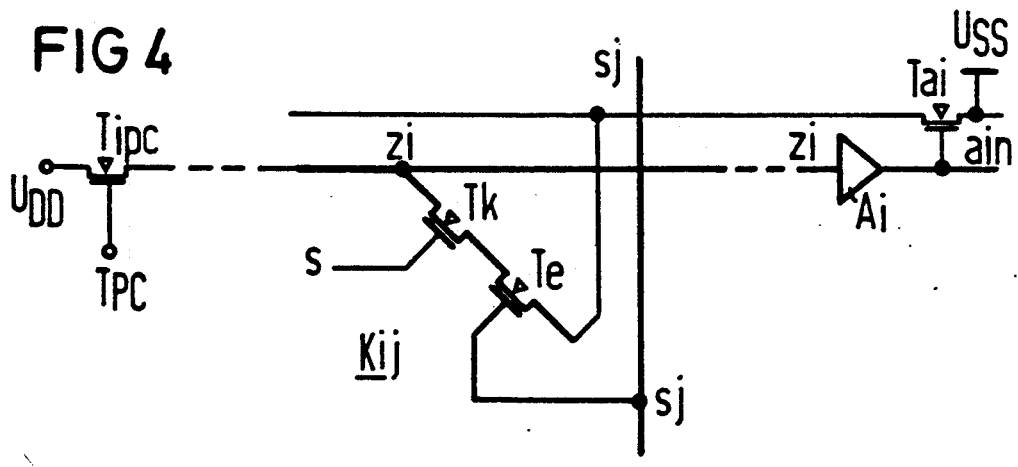

How the switching elements . . . Kij . . . can be realized in circuit-oriented terms is illustrated in FIGS. 2, 3 and 4; the switching elements . . . Kij . . . are each formed with a series circuit of a switching transistor Tk that has its control electrode charged with a through-connect signal or inhibit signal proceeding from the holding memory cell and of an input transistor Te that has its control electrode connected to the appertaining matrix input line sj. The series circuit has the main electrode of the one transistor Tk (in FIG. 3 and FIG. 4) or Te (in FIG. 2), that is connected opposite from the series circuit, connected to the appertaining matrix output line zi.

The matrix output line zi is connected via a precharging circuit to a pre-charging potential source proceeding from which the matrix output line zi ca be charged to a pre-charging potential lying between the two operating potentials or to one of the two operating potentials itself. A pre-charging potential source for a pre-charging potential lying between the two operating potentials can, in particular, be formed in a fundamentally known manner (see for example, European Patent A 0 249 837) with a feedback CMOS inverter via which the matrix output line, in a pre-charging phase of a bit through-connect time span, is at least approximately charged to the potential corresponding to the threshold of the inverter. By contrast thereto, the matrix output line zi in the exemplary embodiments shown in FIGS. 2-4 is connected to one terminal ($U_{SS}$ in FIG. 2; $U_{DD}$ in FIG. 3, FIG. 4) of the operating voltage source $U_{DD}$-$U_{SS}$ via a pre-charging circuit that, as may also be seen from FIGS. 2-4, is formed in a known fashion (see for example, European Patent A 0 262 479) with a pre-charging transistor Tipc that has its control electrode connected to a pre-charging clock line $T_{PC}$.

The main electrode of the other transistor Te (in FIG. 3 and FIG. 4) or Tk (in FIG. 2) that is connected opposite from the series circuit is continuously—i.e. not clock-controlled—connected to the other terminal $U_{SS}$, ground (in FIG. 3 and FIG. 4) or $U_{DD}$ (in FIG. 2) of the operating voltage source, to which end, given direct connection according to FIG. 2 and FIG. 3, the corresponding operating voltage terminal ($U_{SS}$, ground or, $U_{DD}$ in FIG. 5 and FIG. 6) of the cross-point-associated holding memory cell Hij (in FIG. 1, FIG. 5 and FIG. 6) can be utilized. As a result the operating voltage supply of the cross-point-associated holding memory cell that is already required can be co-utilized for feeding the switching element controlled by this holding memory cell. In the exemplary embodiment of FIG. 4, the main electrode of the other transistor (Te), that is connected opposite from the series circuit, is connected to the other terminal $U_{SS}$ of the operating voltage source via a transistor Tai individually associated to the matrix output line that has its control electrode connected to the output ai of an output amplifier circuit Ai that is individually associated to the matrix output line. Given a corresponding change of signal status at the output ai of the output amplifier circuit Ai, the transistor Tai individually associated to the matrix output line is thereby inhibited, so that a further charge reversal of the output line is avoided and the signal boost is thus limited.

As may be seen from FIG. 2, the transistor series circuit Tk-Te of every switching element Kij can have its input transistor Te connected to the matrix output line zi. Then, as seen proceeding from the matrix output line zi, the input transistor Te is, in a sense, transparent, so that changes in signal status on the matrix input line sj are transmitted via the channel capacitance of the input transistor Te onto the matrix output line Zi even when the cross-point Kij is inhibited. This transmission can be avoided when the sequence of input transistor Te and switching transistor Tk is interchanged in the transistor series circuit Tk; Te of every switching element Kij. As may also be seen from FIG. 3 and from FIG. 4, the transistor series circuit Tk-Te of every switching element Kij then has its switching transistor Tk connected to the matrix output line zi.

Preferably, n-channel transistors will be utilized as the circuit transistors. Accordingly, the transistors in the exemplary embodiments of FIGS. 2 and 4 are all of the n-channel type, whereas the transistors (Te, Tk) provided in the switching element . . . Kij . . . in the exemplary embodiment of FIG. 3 are of the n-channel type and the pre-charging transistors (Tipc) are of the p-channel type.

Figure 7:
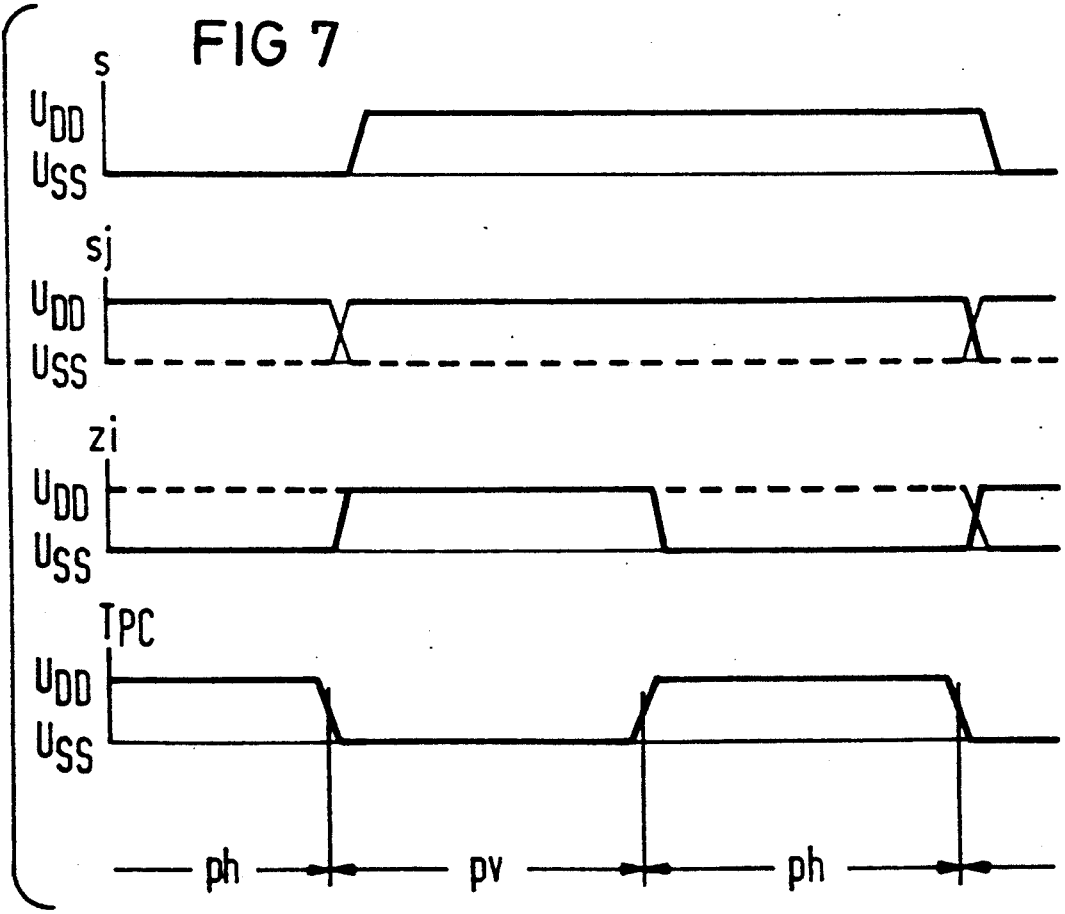
FIG. 7 is a graph depicting signal statuses.

A corresponding pre-charging clock signal $T_{PC}$ that charges the control electrode of every pre-charging transistor (Tipc) effects that every pre-charging transistor (Tipc) is transmissive in every pre-charging phase pv (in FIG. 7) of a bit period that is subdivided by the pre-charging clock signal into such a pre-charging phase pv and into the remaining bit through-connect time span (ph in FIG. 7). As a result the matrix output lines . . . zi . . . are at least approximately charged (during the pre-phase pv) to the respective operating potential ($U_{SS}$ in FIG. 2; $U_{DD}$ in FIG. 3 and FIG. 4) via the respective pre-charging transistor (Tipc in FIGS. 2-4). Such a pre-charging clock signal for the exemplary embodiments of FIGS. 2 and 3 is shown in FIG. 7 in line $T_{PC}$; the inverted pre-charging clock signal is used for the exemplary embodiment of FIG. 4.

In the following main phase, ph (see FIG. 7 bottom), the pre-charging transistors Tipc (in FIGS. 2-4) are inhibited in the example by a "HIGH" precharging clock signal $T_{PC}$ (see FIG. 7, line $T_{PC}$). When, in a switching element Kij, its switching transistor Tk (in FIGS. 2-4), which is preferably an n-channel transistor, is transmissive as a consequence of a through-connect signal (in the example, "HIGH"; see FIG. 7, line s) received at its control input s, and when, accordingly, the cross-point is in its through-connect condition, the matrix output line (row line) zi connected to a matrix input line (column line) . . . sj . . . via the associated switching element Kij will be discharged or will remain at the operating potential assumed in the pre-phase pv, dependent on the signal status that corresponds to the bit to be through-connected and that prevails on the appertaining matrix input line (column line) . . . sj . . . .

When the "LOW" signal status prevails on the appertaining matrix input line (column line) sj, as indicated with a broken line in FIG. 7, line sj, and when, accordingly, the (n-channel) input transistor Te (in FIGS. 2-4) of the appertaining switching element Kij is inhibited, then the appertaining matrix output line (row line) zi is not discharged via this switching element Kij. Rather, it retains the pre-charging potential condition ($U_{SS}$ in the exemplary embodiment of FIG. 2; $U_{DD}$ in the exemplary embodiments of FIGS. 3 and 4) under the condition that no other cross-point connected to this matrix output line (row line) zi is situated in the through-connect condition.

When, by contrast, the "HIGH" signal status prevails on the matrix input line (Column line) sj now under consideration, as indicated with a solid line in FIG. 7, line sj, and when, accordingly the input transistor Te (in FIGS. 2-4) of the switching element Kij under consideration is conductive, as is the switching transistor Tk, then the matrix output line (row line) zi is discharged via this switching element Kij and is drawn to the complimentary operating potential ($U_{DD}$ in the exemplary embodiment of FIG. 2; $U_{SS}$ in the exemplary embodiments of FIGS. 3 and 4).

The respective input signal is thus through-connected and inverted via a cross-point unlocked proceeding from its control input s.

The invention is not limited to the particular details of the apparatus depicted and other modifications and applications are contemplated. Certain other changes may be made in the above described apparatus without departing from the rue spirit and scope of the invention herein involved. It is intended, therefore, that the subject matter in the above depiction shall be interpreted as illustrative and not in a limiting sense.

What is claimed is:

1. A broadband signal switching matrix network having a cross-point matrix in FET technology, whose inputs, ej-sj, are each respectively provided with an input driver circuit, Ej, and whose outputs, zi-ai, are each respectively provided with an output amplifier circuit, Ai, and whose switching elements, Kij, respectively controlled by a holding memory cell, Hij, are respectively formed with a series circuit of a switching transistor, Tk, whose control electrode is charged with a through-connect signal or an inhibit signal and of an input transistor, Te, that has its control electrode connected to the appertaining matrix input line, sj, said series circuit having the main electrode of one of the transistors, Tk or Te, that is connected opposite from the series circuit, connected to the appertaining matrix output line, zi, whereby the matrix output line, zi, is connected to a pre-charging potential source via a pre-charging circuit, Tipc, that has an unlocking input connected to a clock signal line, $T_{PC}$, having a pre-charging clock signal that defines a pre-charging phase, pv, of a bit through-connect time span subdivided into the pre-charging phase, pv, and into a remaining bit through-connect time span, so that the matrix output line, zi, is charged to a pre-charging potential in every pre-charging phase, pv, comprising a main electrode of the other transistor of the transistors, Te or Tk, that is connected opposite the series circuit, continuously connected to a terminal of an operating voltage source during both the pre-charging phase, pv, and the remaining bit through-connect time span.

2. The broadband signal switching matrix network according to claim 1, wherein a main electrode of the other transistor of the transistors, Te or Tk, that is connected opposite the series circuit, is connected to the terminal of the operating voltage source via a further transistor, Tai, individually associated to the matrix output line that has its control electrode connected to the output, ai, of an output amplifier circuit, Ai, that is individually associated to the matrix output line.

3. The broadband signals switching matrix network according to claim 1, wherein the transistor series circuit, Tk-Te, of every switching element, Kij, has its switching transistor, Tk, connected to the matrix output line, zi.

4. The broadband signal switching matrix network according to claim 1, wherein the transistor series circuit, Tk-Te, of every switching element, Kij, has its input transistor, Te, connected to the matrix output line, zi.

5. A broadband signal switching matrix network having a cross-point matrix in FET technology, whose inputs, ej-sj, are each respectively provided with an input driver circuit, Ej, and whose outputs, zi-ai, are each respectively provided with an output amplifier circuit, Ai, and whose switching elements, Kij, respectively controlled by a holding memory cell, Hij, are respectively formed with a series circuit of a switching transistor, Tk, whose control electrode is charged with a through-connect signal or an inhibit signal and of an input transistor, Te, that has its control electrode connected to the appertaining matrix input line, sj, said series circuit having the main electrode of one of the transistors, Tk or Te, that is connected opposite from the series circuit, connected to the appertaining matrix output line, zi, whereby the matrix output line, zi, is connected to a pre-charging potential source via a pre-charging circuit, Tipc, that has an unlocking input connected to a clock signal line, $T_{PC}$, having a pre-charging clock signal that defines a pre-charging phase, pv, of a bit through-connect time span subdivided into the pre-charging phase, pv, and into a remaining bit through-connect time span, so that the matrix output line, zi, is charged to a pre-charging potential in every pre-charging phase, pv, comprising a main electrode of the other transistor of the transistors, Te or Tk, that is connected opposite the series circuit, continuously connected to a terminal of an operating voltage source during both the pre-charging phase, pv, and the remaining bit through-connect time span, a main electrode of the other transistor of the transistors, Te or Tk, that is connected opposite the series circuit, connected to the terminal of the operating voltage source via a further transistor, Tai, individually associated to the matrix output line that has its control electrode connected to the output, ai, of an output amplifier circuit, Ai, that is individually associated to the matrix output line, the transistor series circuit, Tk-Te, of every switching element, Kij, having its switching transistor, Tk, connected to the matrix output line, zi.

6. A broadband signal switching matrix network having a cross-point matrix in FET technology, whose inputs, ej-sj, are each respectively provided with an input driver circuit, Ej, and whose outputs, zi-ai, are each respectively provided with an output amplifier circuit, Ai, and whose switching elements, Kij, respectively controlled by a holding memory cell, Hij, are respectively formed with a series circuit of a switching transistor, Tk, whose control electrode is charged with a through-connect signal or an inhibit signal and of an input transistor, Te, that has its control electrode connected to the appertaining matrix input line, sj, said series circuit having the main electrode of one of the transistors, Tk or Te, that is connected opposite from the series circuit, connected to the appertaining matrix output line, zi, whereby the matrix output line, zi, is connected to a pre-charging potential source via a pre-charging circuit, Tipc, that has an unlocking input connected to a clock signal line, $T_{PC}$, having a pre-charging clock signal that defines a pre-charging phase, pv, of a bit through-connect time span subdivided into the pre-charging phase, pv, and into a remaining bit through-connect time span, so that the matrix output line, zi, is charged to a pre-charging potential in every pre-charging phase, pv, comprising a main electrode of the other transistor of the transistors, Te or Tk, that is connected opposite the series circuit, continuously connected to a terminal of an operating voltage source during both the pre-charging phase, pv, and the remaining bit through-connect time span, a main electrode of the other transistor of the transistors, Te or Tk, that is connected opposite the series circuit, connected to the terminal of the operating voltage source via a further transistor, Tai, individually associated to the matrix output line that has its control electrode connected to the output, ai, of an output amplifier circuit, Ai, that is individually associated to the matrix output line, the transistor series circuit, Tk-Te, of every switching element, Kij, having its input transistor, Te, connected to the matrix output line, zi.

* * * * *